US006780661B1

(12) United States Patent
Liu

(10) Patent No.: US 6,780,661 B1
(45) Date of Patent: Aug. 24, 2004

(54) INTEGRATION OF TOP-EMITTING AND TOP-ILLUMINATED OPTOELECTRONIC DEVICES WITH MICRO-OPTIC AND ELECTRONIC INTEGRATED CIRCUITS

(75) Inventor: Yue Liu, Plymouth, MN (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 09/547,538

(22) Filed: Apr. 12, 2000

(51) Int. Cl.[7] .............................................. H01L 21/00
(52) U.S. Cl. .......................... 438/22; 438/250; 385/14; 385/37; 385/129; 385/131; 385/132
(58) Field of Search .................... 438/22, 250; 385/14, 385/37, 129, 131, 132

(56) References Cited

U.S. PATENT DOCUMENTS

| 5,371,822 | A | * | 12/1994 | Horwitz et al. | ............... 385/89 |
| 5,638,469 | A | * | 6/1997 | Feldman et al. | ............... 385/14 |
| 5,703,895 | A | * | 12/1997 | Ghirardi et al. | ............... 372/50 |
| 5,838,703 | A | | 11/1998 | Lebby et al. | .................. 372/43 |
| 5,905,750 | A | | 5/1999 | Lebby et al. | .................. 372/50 |
| 6,410,941 | B1 | | 6/2002 | Taylor et al. | .................. 257/84 |

FOREIGN PATENT DOCUMENTS

| EP | 0881671 A2 | 12/1998 |
| EP | 0905838 A1 | 3/1999 |
| JP | 09223848 | 8/1997 |

OTHER PUBLICATIONS

Coldren et al. "Flip–Chip Bonded, Back–Emitting, Micro-lensed Arrays of Monolithic Vertical Cavity Lasers and Resonant Photodetectors", Electronic Components and Technology Conference, Sep. 1999, pp. 733–740.

Hibbs–Brenner et al., "Packaging of VCSEL Arrays for Cost–Effective Interconnects at <10 Meters", Electronic Components and Technology Conference, Sep. 1999, pp. 747–752.

Kazlas et al., "Monolithic Vertical–Cavity Laser/p–i–n Photodiode Transceiver Array for Optical Interconnects", IEEE Photonics Technology Letters, Nov. 1998, pp 1530–1532, vol. 10, No. 11.

Louderback et al. "Flip–Chip Bonded Arrays of Monolithically Integrated, Microlensed Vertical–Cavity Lasers and Resonant Photodetectors", IEEE Photonics Technology Letters, Mar. 1999, pp. 304–306, vol. II, No. 3.

PCT International Search Report, Oct. 24, 2001, International Application No. PCT/US 00/11996.

* cited by examiner

*Primary Examiner*—Michael S. Lebentritt
(74) *Attorney, Agent, or Firm*—Workman Nydegger

(57) ABSTRACT

An opto-electronic integrated circuit device includes top emitter/detector devices on a substrate. The top emitter/detector devices have top and bottom sides. The top emitter/detector devices are capable of emitting and detecting light beam from the top side, and have top contact pads on the top side. An optically transparent superstrate is attached to the top side. Micro-optic devices such as lenses can be attached to the superstrate. Top contact pads are connected to bottom contact pads. The bottom contact pads are attached to matching pads of an integrated circuit chip to produce an opto-electronic integrated circuit.

30 Claims, 2 Drawing Sheets ary method of integrating an opto-electronic integrated circuit device according to one embodiment of the present invention.

INTEGRATION OF TOP-EMITTING AND TOP-ILLUMINATED OPTOELECTRONIC DEVICES WITH MICRO-OPTIC AND ELECTRONIC INTEGRATED CIRCUITS

GOVERNMENT INTEREST

This invention was made with United States Government support under contract F3060297-2-0122. The Government may have certain rights in the invention.

BACKGROUND OF THE INVENTION

Optical interconnect technology has been successfully implemented in long distance telecommunications, in local area network communication systems, in computer-to-computer, and board-to-board interconnections. The complexity and speed of electronic integrated circuit devices such as microprocessors continue to increase at a very high rate. However, the input and output (I/O) capability of these devices has not been able to scale at the same rate, because of the existing limitations in electronic packaging and integrating of these devices. Also, the current technologies of integrating large arrays of opto-electronic devices with electronic integrated circuit devices require bottom emitting/detecting of a light beam, and these methodologies are generally not scalable for a wafer-scale fabrication and/or integration of both emitters and detectors.

Therefore there is a need for a method of integrating an opto-electronic device with an electronic integrated circuit device for a scalable wafer-scale fabrication, and at the same time providing a large-scale I/O capability to an electronic integrated circuit device.

SUMMARY OF THE INVENTION

These and other aspects, advantages, and features of the present invention will be set forth in part in the description which follows, and in part will become apparent to those skilled in the art by reference to the following description of the invention and referenced drawings, or by practice of the invention. The aspects, advantages, and features of the invention are realized and attained by means of the instrumentalities, procedures, and combinations particularly pointed out in the appended claims and their equivalents.

According to one aspect of the present subject matter, a method of integrating an opto-electronic integrated circuit device includes forming top emitter/detector devices on a substrate such that the top emitter/detector devices have top contact pads on a top side of the top emitter/detector devices, wherein the top side is disposed across from the substrate, and further the substrate has a bottom side that is across from the top side of the top emitter/detector devices. An optically transparent superstrate is attached onto the top side of the top emitter/detector devices such that the optically transparent superstrate having a top surface across from the top side of the top emitter/detector devices. The top contact pads are exposed on the bottom side of the substrate. The bottom contact pads are formed on the bottom side and the bottom contact pads are connected to the top contact pads to bring the top contact pads to the bottom side. Further micro-optic devices can be formed on the top surface of the transparent superstrate to provide optical processing capability to the top emitter/detector devices. The bottom contact pads are attached to matching pads of an electronic integrated circuit device to form an opto-electronic integrated circuit device having a high density optical I/O on an electronic integrated circuit device.

Other aspects of the invention will be apparent on reading the following detailed description of the invention and viewing the drawings that form a part thereof.

BRIEF DESCRIPTION OF THE DRAWINGS

In the drawings, like numerals describe substantially similar components throughout the several views. Like numerals having different letter suffixes represent different instances of substantially similar components.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention. It is understood that the embodiments may be combined, that other embodiments may be utilized, and that structural, logical and electrical changes may be made without departing from the spirit and scope of the present invention. The following detailed description is, therefore, not to be taken in a limiting sense, and the scope of the present invention is defined by the appended claims and their equivalents.

In this document the term top emitter device is understood to refer to a vertical cavity surface emitting laser (VCSEL) or similar device that emits light away from a substrate and having at least one top contact pad on a top side, and the top detector device refers to a metal-semiconductor-metal photodetector (PD) or similar device having at least one top contact pad on the top side. In this document, top side refers to a growing side of the top emitter/detector devices on a substrate, and bottom side refers to a side on the substrate that is across from the top side. Opto-electronic device refers to a substrate including top emitter/detector devices on a top side, and further including a transparent superstrate on the top emitter/detector devices. Top emitter/detector refers to devices emitting and detecting light from the top side of the top emitter/detector devices. The term superstrate refers to a wafer of optically transparent material disposed on a semiconductor substrate including a plurality of top emitter and top detector devices. Also, top surface refers to a surface on the transparent superstrate that is across from the top side, and bottom surface is referred to the exposed top emitter/detector devices and the bottom surface is also understood to be disposed across from the top surface.

Figure 1:
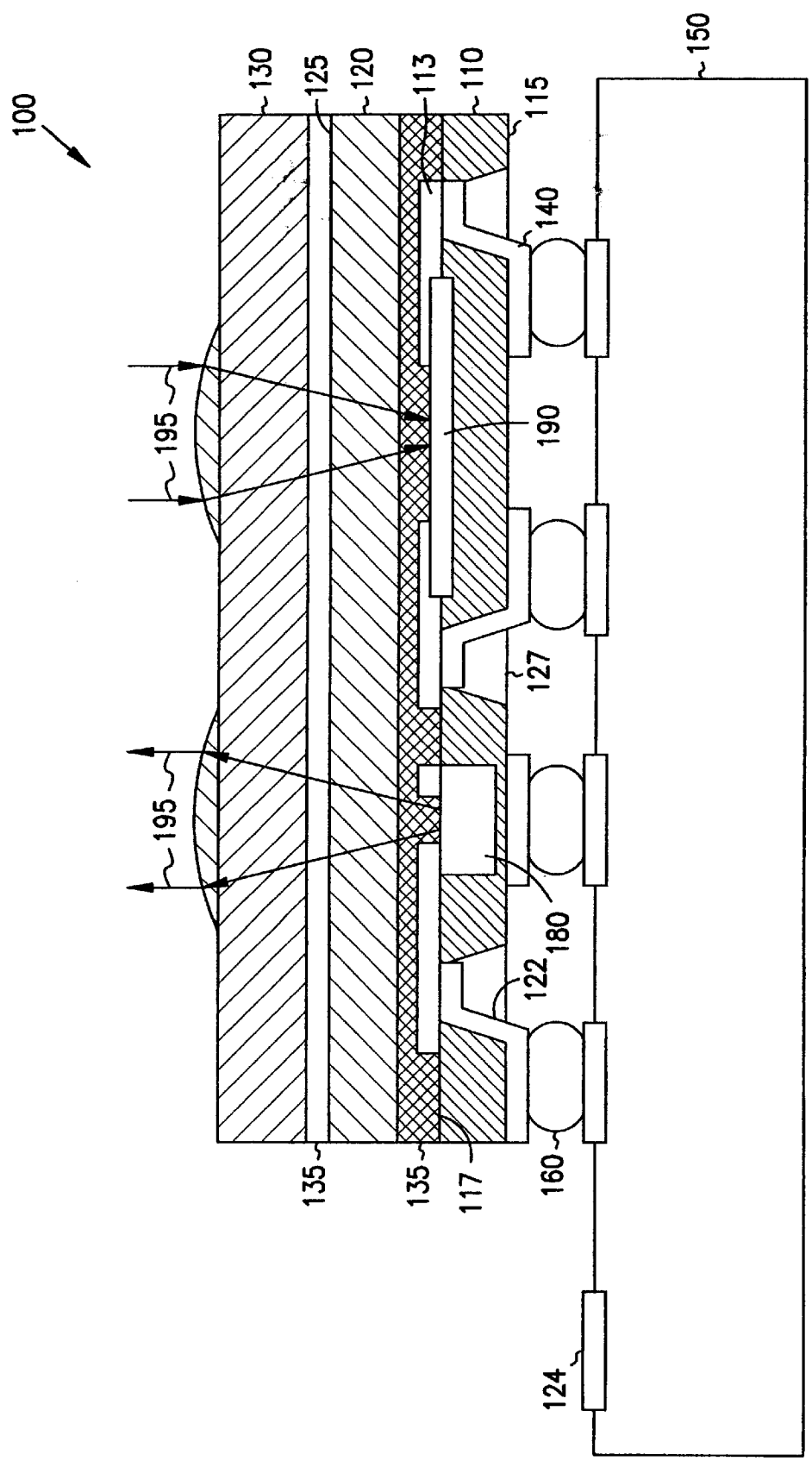
FIG. 1 is a sectional view of one embodiment of the integrating technique of a device packaged according to the invention.

FIG. 1 is a front sectional view, illustrating generally, by way of example, but not by way of limitation, one embodiment of integrating an opto-electronic integrated circuit device 100 according to the present invention. This is accomplished in this embodiment by forming top emitter/detector devices 180 and 190 respectively on a substrate 110 such that the top emitter/detector devices 180 and 190 have a top side 117 across from the substrate 110. In this embodiment the substrate has a bottom side 115 across from the top side 117. Top emitter/detector devices 110 emit and detect light away from the substrate 110. Top emitter/detector devices 180 and 190 have top contact pads 113 on the top side 117. In one embodiment the substrate is a wafer of gallium arsenide. In this embodiment the wafer of gallium arsenide is not transparent to a light beam of 850 nanometers wavelength. Also in this embodiment the wafer of gallium arsenide includes plurality of top emitter/detector devices. The top emitter device 180 is a vertical cavity surface emitting laser (VCSEL) device capable of emitting light away 195 from a planar surface of the substrate, and the top detector device 190 is a metal-semiconductor-metal photodetector device capable of detecting light illuminated from the top side 195. In this embodiment, the top emitter/detector devices 180 and 190 on the substrate 110 are capable of emitting and detecting a light of 850 nanometers wavelength.

An optically transparent superstrate 120 is attached to the top side 117 of the top emitter/detector devices 180 and 190 on the substrate 110 such that the optically transparent superstrate 120 is across from the bottom side 115. The optically transparent superstrate has a top surface 125 across from the top side 117. The optically transparent superstrate 120 is made from a wafer of sapphire in this example. In another embodiment, the optically transparent superstrate is a wafer of glass. In a further embodiment, the materials of optically transparent superstrate 120 and the top emitter/detector devices 180 and 190 on superstrate 110 have similar thermal properties so that they can withstand thermal cycling introduced during subsequent processing and packaging. The optically transparent superstrate 120 can be bonded 135 to the top emitter/detector devices 180 and 190 including the substrate 110. In this embodiment the bonding adhesive 135 also has thermal properties similar to that of the optically transparent superstrate 120 and the top emitter/detector devices. The optically transparent superstrate 120 is transparent to the light of 850 nanometers wavelength. The thickness of the optically transparent superstrate 120 is sufficient to impart mechanical strength to the substrate including the top emitter/detector devices 180 and 190.

The opto-electronic integrated circuit device 100 can further include micro-optic devices 130 integrated to the top surface 125 of the optically transparent superstrate 120. The micro-optic devices 130 can be directly formed on to the top surface of the optically transparent superstrate 120. The micro-optic devices 130 can also be attached to the top surface of the optically transparent superstrate 120. In this embodiment the micro-optic devices 130 are aligned with the top emitter/detector devices 110 to provide an optical processing capability to the top emitter/detector devices 180 and 190 (to an input light beam and an output light beam) on the substrate 110. In one embodiment the optical processing includes beam shaping for the top emitter/detector devices 180 and 190.

The top contact pads 113 of the top emitter/detector devices 110 are brought to the bottom contact pads 140 by a through-the-via 127 metal layer 122. In one embodiment the top contact pads 113 are brought to the bottom side by thinning the gallium arsenide substrate 110 and by forming vias through-the-gallium arsenide substrate. An electronic integrated circuit device 150 is attached to the top emitter/detector devices 180 and 190. The bottom contact pads 140 of the top emitter/detector devices 180 and 190 on the substrate 110 can be bump bonded, using solder balls 160, to matching pads 124 of the electronic integrated circuit device 150 to provide a high capacity optical I/O capability to the electronic integrated circuit device 150.

Figure 2:
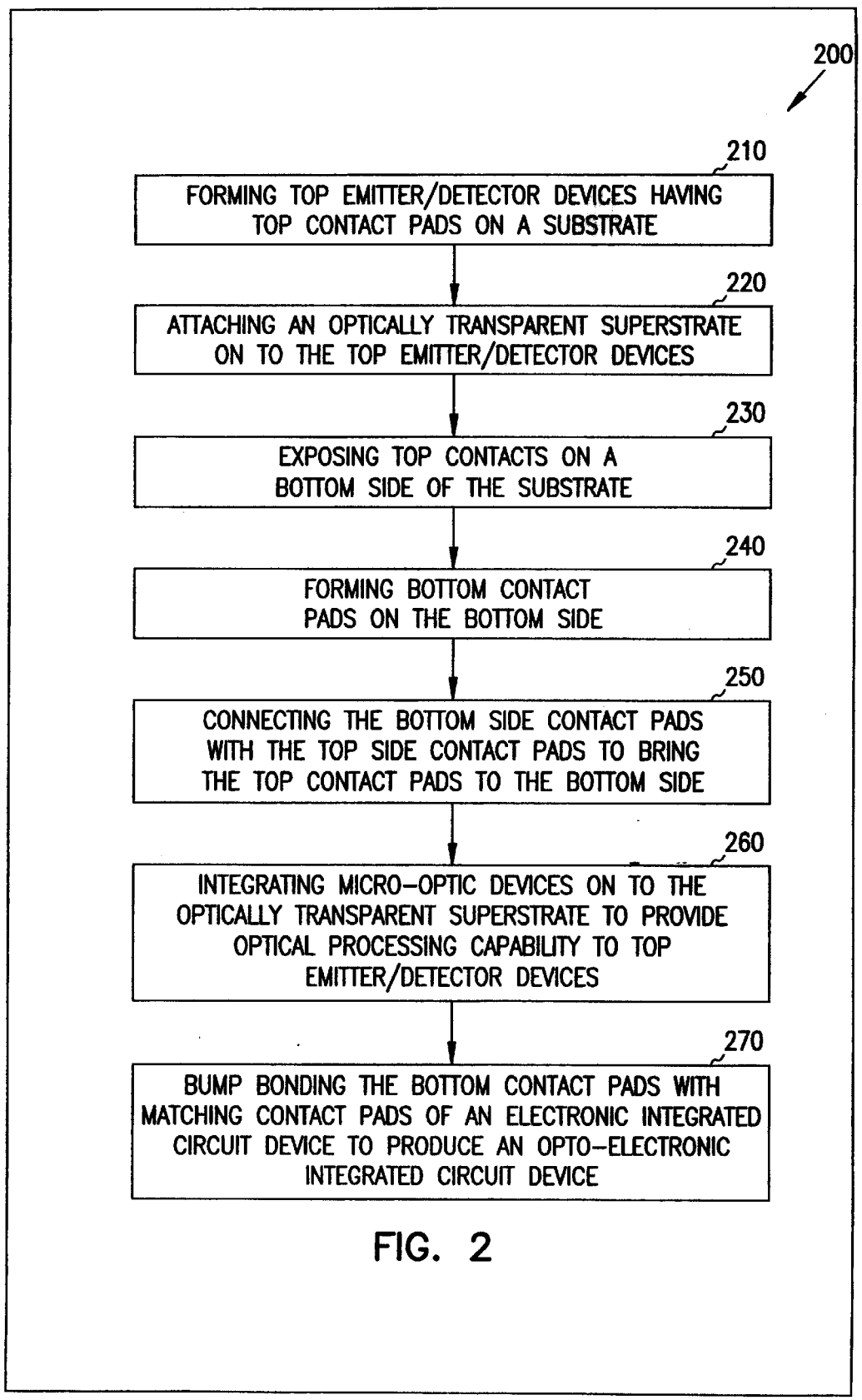
FIG. 2 is a flow diagram of an illustrative method of integrating a device according to the invention.

FIG. 2. is a flow diagram illustrating generally one embodiment of a method 200 of integrating an opto-electronic device having a high density I/O capability to an electronic integrated circuit device. Method 200 includes forming top emitter/detector devices on a top side of a substrate 110. In this embodiment, the top emitter/detector devices have top contact pads on the top side. The substrate includes a back side that is across from the top side. The top emitter/detector devices further includes an etch stop layer on the top side. The top emitter device includes a VCSEL capable of emitting light away from the substrate, and the top detector includes a metal-semiconductor-metal PD capable of detecting light illuminated from the top side. Forming of the top emitter/detector devices on to the substrate comprises forming 2-dimensional arrays of VCSEL/PD devices on a wafer, which can be of gallium arsenide. The top emitter/detector devices can have a pitch of 50 micrometers or less, and the wafer of gallium arsenide can be about 625 microns in thickness. In this embodiment the gallium arsenide is not transparent to a light beam of 850 nanometers wavelength. The top emitter/detector devices on the substrate can be tested and qualified at this point if desired.

The next step 220 in the process is attaching an optically transparent superstrate 120 onto the top side of the top emitter/detector devices such that the optically transparent superstrate has a top surface across from the top side of the substrate 220. The optically transparent superstrate can be made from a material transparent to the light of 850 nanometers wavelength, such as sapphire or glass. The optically transparent superstrate is of sufficient thickness to provide mechanical support to the exposed top emitter/detector devices. The optically transparent superstrate and the top emitter/detector devices can be made of materials having similar thermal properties, to withstand thermal cycling introduced during subsequent processing and packaging. The optically transparent superstrate can be made from sapphire or glass that are transparent to a light beam of 850 nanometers wavelength. In this embodiment the optically transparent superstrate and the substrate have similar thermal properties to withstand thermal cycling introduced during a subsequent processing and packaging operations.

The next step 230 in the process is exposing the top contact pads to the bottom side 240. This step can be achieved by thinning the substrate from the back side of the substrate such that the top contact pads are exposed to the bottom side. The thinning step can also include forming via in the substrate from the thinned bottom side to expose the top contact pads to the bottom side. Thinning can be by mechanically lapping the bottom side of the gallium arsenide substrate to a predetermined thickness. In one embodiment the predetermined thickness is about 50 microns. A via can be formed by chemically etching the bottom side of the thinned substrate to the etch stop layer, to expose the top contact pads to the bottom side. Alternatively, the forming the via comprises mechanically drilling the bottom side of the thinned substrate to expose the top contact pads to the bottom side. The exposing step can also include removing the substrate to expose the top contact pads to the bottom side.

Step 240 in the process includes forming bottom contact pads on the bottom side. The next step 250 includes connecting the bottom contact pads with the top contact pads to bring the top contact pads to the bottom side to form an opto-electronic device. This can be done by forming through-the-via metal to connect the top contact pads to the bottom contact pads. In one embodiment forming through-the-via includes plating through-the-via metal to connect the top contact pads to the bottom contact pads. Connecting the top contact pads to the bottom contact pads facilitates in bringing the top contact pads in a same plane as matching pads of an electronic integrated circuit device, and also helps in matching patterns the top contact pads with the matching pads of the electronic integrated circuit device and further helps in making it easier to integrate with the electronic integrated circuit device. Also connecting the top contact pads with bottom contact pads gives the flexibility of locating the bottom contact pads anywhere as needed, without interfering with the location of the emitter/detector devices.

Step 260 in the process involves integrating a wafer of micro-optic devices 130 onto the top surface of the optically transparent superstrate 120 such that the micro-optic devices are aligned with corresponding top emitter/detector devices 260 to provide an optical processing capability to them. In one embodiment the micro-optic devices are formed onto the top surface of the optically transparent superstrate. In another embodiment the micro-optic devices are attached to the top surface of the optically transparent superstrate. The wafer of micro-optic devices can also be bonded to the top surface of the optically transparent superstrate. Optical processing can include, for example, beam shaping, focusing a light beam, filtering the light beam, and tilting the light beam. The wafer of micro-optic devices can be fabricated on a separate substrate, then tested and qualified before integrating it onto the opto-electronic devices.

Step 270 in the process bonds the opto-electronic devices to the integrated circuit.

This can include dicing the opto-electronic devices including the micro-optic devices, to produce opto-electronic chips. Then the back side contact pads of the opto-electronic chips are attached with matching pads of an electronic integrated circuit device to produce an opto-electronic integrated circuit device having a high density optical I/O on an electronic integrated circuit device. In one embodiment the back side contact pads of the opto-electronic chips are bump bonded to the matching pads of the electronic integrated circuit device.

Conclusion

The above described method provides, among other things, an electronic integrated circuit device having a high I/O capacity in an optical domain. The high I/O capacity is accomplished by forming top emitter/detector devices on a top side of a substrate, wherein the substrate has a bottom side across from the top side. The top emitter/detector devices emit and detect light on the top side. The top emitter/detector have top contact pads on the top side. An optically transparent superstrate is attached to the top side of the top emitter/detector devices such that the optically transparent superstrate is across from the bottom side and the optically transparent superstrate has a top surface across from the top side forming an opto-electronic device. The top contact pads are brought to the back side by connecting the top contact pads with bottom contact pads. Micro-optic devices can be attached to the top surface of the transparent substrate such that the micro-optic devices provide optical processing capability. Then an electronic integrated circuit device is attached to the bottom side of the substrate such that the bottom contact pads are in contact with matching pads of the electronic integrated circuit device to form an opto-electronic integrated circuit device having a high I/O capacity.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of integrating opto-electronic devices, comprising:

forming a wafer including a plurality of top emitter/detector devices on a substrate, wherein the top emitter/detector devices having top contact pads, wherein the top emitter/detector devices having a top side on the top contact pads and disposed across from the substrate, and wherein the substrate having a bottom side across from the top side;

attaching a wafer of optically transparent superstrate onto the top side of the top emitter/detector devices such that the optically transparent superstrate has a top surface across from the top side of the substrate;

exposing the top contact pads to the bottom side;

forming bottom contact pads on the bottom side; and connecting the bottom contact-pads with the top contact pads.

2. The method of claim 1, wherein the top emitter and top detector devices comprises a plurality of top emitter/detector devices for an opto-electronic chip.

3. The method of claim 1, wherein the top emitter device is a vertical cavity surface emitting laser device capable of emitting light away from the substrate.

4. The method of claim 1, wherein the top detector device is a metal-semiconductor-metal photo detector capable of detecting light illuminated from the top side.

5. The method of claim 1, wherein the top emitter/detector devices comprises top emitter/detector devices capable of emitting and detecting a light beam of 850 nanometers wavelength respectively.

6. The method of claim 1, wherein the substrate is a wafer of gallium arsenide.

7. The method of claim 6, wherein the gallium substrate is not transparent to a light beam of 850 nanometers wavelength.

8. The method of claim 6, further comprising testing the top emitter/detector devices to qualify after fabricating the top emitter/detector devices on the wafer of gallium arsenide substrate.

9. The method of claim 6, wherein the wafer of gallium arsenide substrate is about 625 microns in thickness.

10. The method of claim 1, wherein the optically transparent superstrate is made from a material transparent to a light beam of 850 nanometers wavelength.

11. The method of claim 1, wherein the top emitter and top detector devices and the optically transparent superstrate have similar thermal properties to withstand thermal cycling used during a subsequent processing and packaging.

12. The method of claim 1, wherein the optically transparent superstrate is made from a wafer of sapphire.

13. The method of claim 1, wherein the optically transparent superstrate is made from a wafer of glass.

14. The method of claim 1, wherein the exposing the top contact pads to the bottom side further includes:

thinning the substrate from the bottom side to a predetermined thickness; and forming via in the substrate from the thinned bottom side to expose the top contact pads to the bottom side.

15. The method of claim 14, wherein the predetermined thickness is about 50 microns.

16. The method of claim 14, wherein the forming via comprises chemically etching the bottom side of the thinned substrate to expose the top contact pads to the bottom side.

17. The method of claim 14, wherein the forming via comprises mechanically drilling the bottom side of the thinned substrate to expose the top contact pads to the bottom side.

18. The method of claim 14, wherein connecting bottom contact pads with the top contact pads further includes forming a thru-the-via metal to connect the bottom contact pads with the top contact pads.

19. The method of claim 1, wherein the exposing the top contact pads to the bottom side further includes removing the substrate from the bottom side to expose top contact pads to the bottom side.

20. The method of claim 1, further comprising integrating micro-optic devices on to the top surface of the optically transparent superstrate to provide an optical processing capability to the top emitter and top detector devices.

21. The method of claim 20, wherein the micro-optic devices comprises a wafer of micro-optic devices.

22. The method of claim 21, wherein integrating the wafer of micro-optic devices on to the top surface of the optically transparent superstrate comprises attaching the wafer of micro-optic devices on to the top surface of the optically transparent superstrate.

23. The method of claim 21, wherein integrating the wafer of micro-optic devices on to the top surface of the optically transparent superstrate comprises forming a wafer of micro-optic devices on to the top surface of the optically transparent superstrate.

24. The method of claim 20, wherein the optical processing comprises beam shaping.

25. The method of claim 20, wherein the beam shaping includes beam focusing.

26. The method of claim 20, wherein the beam shaping includes beam filtering.

27. The method of claim 20, wherein the beam shaping includes beam tilting.

28. The method of claim 20, further comprising attaching the bottom contact pads of the top emitter/detector devices with matching pads of an electronic integrated circuit device to produce an opto-electronic integrated circuit device having a having a high density optical I/O capability on an electronic integrated circuit device.

29. The method of claim 28, wherein the attaching the bottom contact pads comprises bump bonding the bottom contact pads of the top emitter/detector devices with the matching pads of the electronic integrated circuit device to produce the opto-electronic integrated circuit device having a having a high density optical I/O capability on the electronic integrated circuit device.

30. A method of integrating an opto-electronic device having a high density optical I/O capability on an electronic integrated circuit device, comprising:

forming a plurality of top emitter/detector devices having top contact pads on a wafer of gallium arsenide substrate, wherein the plurality of top emitter/detector devices having a top side on the top contact pads and disposed across from the wafer of gallium arsenide substrate, and wherein the substrate having a bottom side across from the top side;

attaching a wafer of optically transparent superstrate onto the top side of the plurality of top emitter/detector devices such that the wafer of optically transparent superstrate having a top surface across from the top side;

exposing the top contact pads to the bottom side of the wafer of substrate;

forming bottom contact pads on to the bottom side of the wafer of substrate;

connecting the bottom contact pads with the top contact pads to form a plurality of opto-electronic devices;

integrating a wafer of micro-optic devices on to the top surface of the optically transparent superstrate such that the micro-optic devices provide an optical processing capability to the plurality of top emitter/detector devices;

dicing the plurality of opto-electronic devices including the micro-optic devices to produce opto-electronic chips; and bump bonding the bottom contact pads of an opto-electronic chip with matching pads of an electronic integrated circuit device to produce an opto-electronic integrated circuit device having a having a high density optical I/O capability on an electronic integrated circuit device.

* * * * *